United States Patent
Wu et al.

(10) Patent No.: US 8,861,214 B1
(45) Date of Patent: Oct. 14, 2014

(54) HIGH RESISTIVITY SUBSTRATE FOR INTEGRATED PASSIVE DEVICE (IPD) APPLICATIONS

(75) Inventors: Albert Wu, Palo Alto, CA (US); Chuan-Cheng Cheng, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 1788 days.

(21) Appl. No.: 11/932,733

(22) Filed: Oct. 31, 2007

Related U.S. Application Data

(60) Provisional application No. 60/866,978, filed on Nov. 22, 2006.

(51) Int. Cl.
| H05K 7/02 | (2006.01) |
| H05K 7/06 | (2006.01) |
| H05K 7/08 | (2006.01) |
| H05K 7/10 | (2006.01) |

(52) U.S. Cl.
USPC ........... 361/760; 361/763; 361/764; 361/782; 361/784; 174/250; 174/252; 174/259

(58) Field of Classification Search
USPC ........... 361/780–782; 257/701–703, 777–780
See application file for complete search history.

(56) References Cited

U.S. PATENT DOCUMENTS

| 4,739,443 | A | * | 4/1988 | Singhdeo ...................... 361/689 |
| 5,876,536 | A | * | 3/1999 | Kumar et al. ............... 156/89.11 |
| 6,269,209 | B1 | * | 7/2001 | Terada et al. .................... 385/51 |
| 6,469,370 | B1 | * | 10/2002 | Kawahara et al. ............ 257/678 |
| 6,642,610 | B2 | * | 11/2003 | Park et al. ...................... 257/678 |
| 6,939,778 | B2 | * | 9/2005 | Harpster et al. .............. 438/406 |
| 7,183,650 | B2 | * | 2/2007 | Shiono et al. ................. 257/758 |
| 7,226,653 | B2 | * | 6/2007 | Straub et al. ................. 428/210 |
| 2004/0125579 | A1 | * | 7/2004 | Konishi et al. ................ 361/783 |
| 2004/0206534 | A1 | * | 10/2004 | Lucke et al. ................. 174/52.1 |
| 2005/0253257 | A1 | * | 11/2005 | Chiu et al. .................... 257/724 |

\* cited by examiner

*Primary Examiner* — Tuan T Dinh

(57) ABSTRACT

Substrates for integrated passive devices are described herein. Embodiments of the present invention provide substrates including a glass layer and at least one passive device disposed thereon. According to various embodiments of the present invention, the glass layer may have a thickness adapted to minimize conductive and/or other interactions between the substrate and the at least one passive device. Other embodiments may be described and claimed.

4 Claims, 6 Drawing Sheets

HIGH RESISTIVITY SUBSTRATE FOR INTEGRATED PASSIVE DEVICE (IPD) APPLICATIONS

CROSS REFERENCE TO RELATED APPLICATIONS

The present application is a non-provisional application of, and claims priority to, provisional application 60/866978, entitled "NEW APPROACH FOR HIGH RESISTIVITY SUBSTRATE ON IPD APPLICATION," filed on Nov. 22, 2006. The entire disclosure of said provisional application is hereby incorporated by reference in its entirety.

TECHNICAL FIELD

Embodiments of the present invention relate to integrated passive devices (IPDs), in particular, to platforms for IPD circuits.

BACKGROUND

As advanced modules for radio frequency electrical circuits (e.g., portable consumer devices such as cellular telephones) continue to increase in popularity so too does the need to further shrink die size and cost. In addition, the continuing need for smaller devices requires novel approaches for the integration of the numerous passive elements on the platform. Accordingly, miniaturization of passive devices and passive device circuits is an important goal in radio frequency device technology, The continuing effort to miniaturize devices has led to various advances in producing integrated passive devices (IPD) including, for example, thin film technology wherein one or more of a resistor, a capacitor, and an inductor are but as integrated thin film devices on a substrate. Problematic in that situation as well as with other IPD techniques, however, is that because passive devices are generally formed directly on the substrate, electrical interactions between the substrate and the passive devices are known to occur. This occurrence runs counter to the general desirability for high performance circuits to include passive devices with high Quality (Q) factors.

SUMMARY OF THE INVENTION

In view of the challenges in the state of the art, embodiments of the present invention are directed to substrates for integrated passive devices including a glass layer disposed on at least a portion of the substrate. In various embodiments, one or more passive devices may be mounted onto the glass layer. A passive device may be any one known in the art including, for example, an inductor, a capacitor, or a resistor.

According to various embodiments of the present invention, the glass layer may have a thickness adapted to minimize conductive and/or other interactions between the substrate and the at least one passive device. For example, in various embodiments, the glass layer may have a thickness of at least 50 micrometers.

In some embodiments, the microelectronic device may include a material adapted to couple the glass layer to the silicon layer. For example, the microelectronic device may include an adhesive material disposed between the silicon layer and the glass layer. In some embodiments, the microelectronic device may include a nitride layer disposed between the silicon layer and the glass layer, with the nitride layer promoting adhesion between the layers.

According to various embodiments, the microelectronic device may be incorporated into an integrated passive device (IPD) module. In some of the embodiments, the IPD module may include a microelectronic device including a silicon layer and a glass layer, and may further include a passive device and an integrated circuit chip mounted thereon. In some embodiments, the microelectronic device may be mounted onto a carrier substrate.

In various embodiments, the glass layer may include one or more bond pads disposed thereon for electrically interconnecting with the passive device, the integrated circuit chip, and/or some other component. In some embodiments, the passive device and/or the integrated circuit chip may also include bonds pads for electrically interconnecting with another component.

According to various embodiments, the IPD module may be included in type of device known in the art. For example, in various embodiments, the IPD module may be included in an apparatus selected from a group comprising a mobile phone, a laptop computer, a personal digital assistant, a gaming device, a music player, and a video player.

Other features that are considered as characteristic for various embodiments of the present invention are set forth in the appended claims.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

The description may use the phrases "in an embodiment," "in embodiments," or "in various embodiments," which may each refer to one or more of the same or different embodiments. Furthermore, the terms "comprising," "including," "having," and the like, as used with respect to embodiments of the present invention, are synonymous. The phrase "A/B" means A or B. For the purposes of the present invention, the phrase "A and/or B" means "(A), (B), or (A and B)." For the purposes of the present invention, the phrase "at least one of A, B, and C" means "(A), (B), (C), (A and B), (A and C), (B and C), or (A, B and C)." For the purposes of the present invention, the phrase "(A)B" means "(B) or (AB)," that is, A is an optional element.

Figure 1:
FIG. 1 is a cross-sectional side view of a microelectronic device known in the art.

According to various embodiments of the present invention, a novel structure is disclosed, which may avoid problems in the prior art such as those that may be encountered by the microelectronic device illustrated in FIG. 1. As illustrated, the microelectronic device includes a substrate 10 with an integrated passive device 20 disposed thereon. By having integrated passive device 20 mounted directly onto substrate 10, integrated passive device 20 and substrate 10 may experience undesirable interactions. For example, in some cases, eddy currents may be produced as a result of an inductor (a type of passive device) coupling with a conductive substrate such as a silicon substrate, which has a relatively low resistivity. The interaction between the integrated passive device and substrate 10 may lead to any one or more of decreased Quality (Q) factor, parasitic capacitance, substrate loss, and/or other effects. Even in cases wherein an oxide or polyimide layer is formed on the substrate, integrated passive devices may nevertheless interact with the substrate due to an inability to create sufficient distance between the passive devices and the substrate using those methods.

Figure 2:
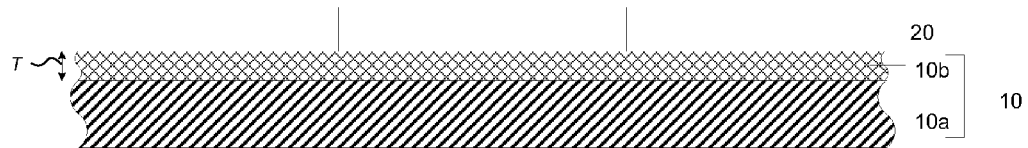
FIG. 2 is a cross-sectional side view of a microelectronic device, in accordance with various embodiments of the present invention.

According to various embodiments of the present invention and as illustrated in FIG. 2, a microelectronic device may include a substrate 10 including a silicon layer 10a and a glass layer 10b disposed on at least a portion of silicon layer 10a. Silicon layer 10a may comprise, for example, a silicon wafer. The microelectronic device may also include one or more integrated passive devices 20. Integrated passive device 20 may comprise any one or more known passive devices including, for example, an inductor, a capacitor, and a resistor. By mounting passive device 20 so that passive device 20 is not formed directly on silicon layer 10a, but rather at a distance created by the thickness T of glass layer 10b, undesirable interactions between passive device 20 and silicon layer 10a may be avoided or minimized. For example, conduction between silicon layer 10a and an inductor may be minimized. In effect, the resistivity of substrate 10 may be increased from the perspective of passive device 20 due to passive device 20 being further away from the relatively low resistivity silicon layer 10a. In various embodiments, the Q factor may correspondingly increase.

In various embodiments, glass layer 10b may be formed to have thickness T adapted to eliminate or minimize conduction and/or other interactions between silicon layer 10a and passive device 20. For example, thickness T of glass layer 10b may be 50 micrometers or more, depending on the application. In various other embodiments, however, a thinner glass layer 10b may be enlisted. For example, thickness T of glass layer 10b may be configured so as to achieve a microelectronic device having certain other desirable characteristics in addition to an increased Q factor. For example, a thinner glass layer 10b may be enlisted so as to achieve a smaller overall size of the microelectronic device, even though the thinner glass layer 10b may result in an increased level of interaction between silicon layer 10a and passive device 20.

Glass layer 10b may be formed on silicon layer 10a according to one or more various operations. For various embodiments, glass layer 10b may be formed on silicon layer 10a using a conventional low cost/high volume silicon process, advantageously allowing for integration into existing microelectronic device fabrication operations. In other embodiments, however, the novel structures disclosed herein may be fabricated by any operation suitable for the purpose.

According to some embodiments, glass layer 10b may be formed on silicon layer 10a by mounting a glass wafer onto a silicon wafer. In various ones of the embodiments, the glass wafer may be mounted onto the silicon wafer using a material adapted to couple the glass wafer to the silicon wafer. For example, an adhesive material may be enlisted to couple the glass wafer to the silicon wafer. In other embodiments, a surface treatment operation may be enlisted to modify the surface of the silicon wafer and/or the glass wafer to effect coupling. For example, in some embodiments, ammonium hydroxide ($NH_4OH$) and/or other substances may be applied to the silicon wafer thereby creating a nitride layer on the silicon wafer, which may then bond with silicon atoms of the glass wafer, bonding the glass layer with the silicon substrate. Pressure and/or an elevated temperature may be enlisted to aid in the bonding.

In some other embodiments, an anodic bonding operation may be enlisted for coupling a glass wafer with a silicon wafer. According to various ones of the embodiments, the glass wafer and the silicon wafer may be clamped, or otherwise secured together, between two electrodes and exposed to an elevated temperature. A potential applied between the electrodes results in an electric field that may cause the surface of the glass wafer to become reactive with the silicon wafer, and thereby bonding the glass wafer to the silicon wafer.

In still further embodiments, glass layer 10b may be formed on silicon layer 10a by a deposition operation. For example, in various embodiments, glass layer 10b may be formed by sputtering glass onto silicon layer 10a. In other embodiments, glass layer 10b may be formed by spin-coating glass onto silicon layer 10a. Other known techniques for depositing glass onto silicon layer 10a may be enlisted within the scope of the present invention.

Figure 3:
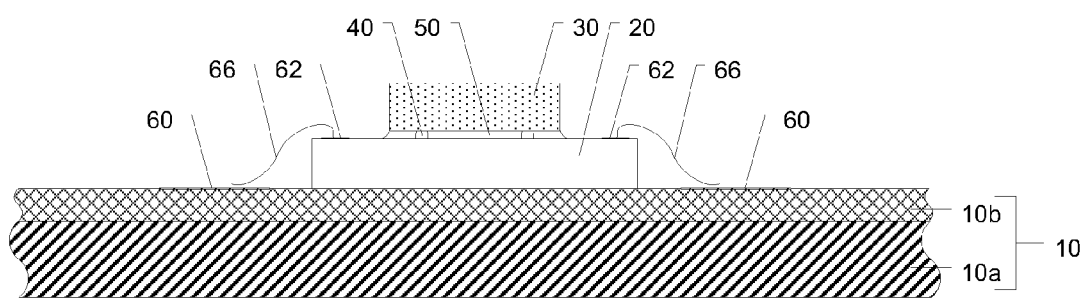
FIG. 3 is a cross-sectional side view of another microelectronic device, in accordance with various embodiments of the present invention.
Figure 3A:
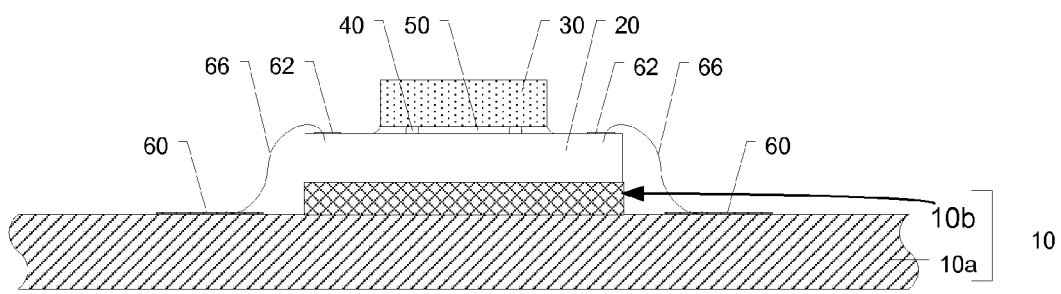
FIG. 3A is a cross-sectional side view of another microelectronic device, in accordance with various embodiments of the present invention.

In various embodiments, glass layer 10b may be formed on less than an entire surface of silicon layer 10a. For example, in some embodiments, glass layer 10b may be formed only at sites to be occupied by one or more passive devices 20 so that only the one or more passive devices 20 are elevated above silicon layer 10a. For example, as illustrated in FIG. 3A, in some embodiments, glass layer 10b may be formed on less than an entire surface of silicon layer 10a, e.g., may be formed only at sites to be occupied by one or more passive devices 20 so that only the one or more passive devices 20 are elevated above silicon layer 10a. In other embodiments, glass layer 10b may be formed over some regions of silicon layer 10a and not over others. For example, if multiple passive devices 20 are to be located grouped together on a certain region of substrate 10, then that entire region may have glass layer 10b formed thereon, while other regions may not.

The microelectronic device may further comprise one or more integrated circuit chips for achieving a desired functionality. As illustrated in FIG. 3, an integrated circuit chip 30 is mounted on passive device 20. Integrated circuit chip 30 may be any known integrated circuit device including, for example, a radio-frequency device, a digital device, an analog device, and/or a micro-electro-mechanical system device.

Figure 4:
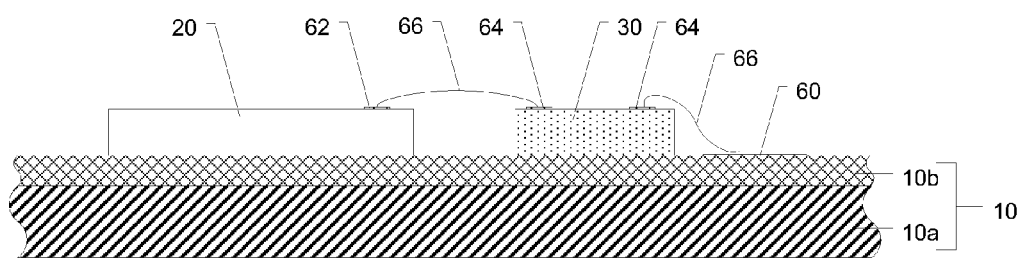
FIG. 4 is a cross-sectional side view of another microelectronic package, in accordance with various embodiments of the present invention.

Integrated circuit chip 30 may be mounted onto and/or electrically coupled to passive device 20 (or directly to substrate 10 as illustrated in FIG. 4) using any mechanism suitable for the application. For example and as illustrated in FIG. 3, integrated circuit chip 30 is a flip-chip mounted onto and electrically coupled to one or more bond pads 62 located on passive device 20, using solder bumps 40. Passive device 20 may then be electrically coupled, via wires 66, to one or more bond pads 60 located on glass layer 10b.

In some of the embodiments enlisting solder bumps 40 and as illustrated in FIG. 3, an underfill material 50 may also be included to fill in vacant spaces not occupied by solder bumps 40, which may provide additional mechanical stability to the structure. In other embodiments, other techniques may be enlisted for mounting integrated circuit chip 30 to passive device 20 (or glass layer 10b, as described earlier). For example, a conductive adhesive or other die-attach material may be used for mounting.

In various other embodiments, integrated circuit chip 30 may not be flip-chip mounted. For example, in the embodiment illustrated in FIG. 4, integrated circuit chip 30 is mounted active side up directly onto substrate 10, with one or more bonds pads 64 located thereon electrically interconnected via wires 66 to bond pad 62 of passive device 20, and to bond pad 60 of substrate 10. Although not illustrated, integrated circuit chip 30 may be mounted on passive device 20, similarly to the embodiment of FIG. 3, except that integrated circuit chip 30 may be disposed active side up and electrically interconnected, via wire 66, to one or both of passive device 20 and substrate 10.

With regard to mounting passive device 20 onto substrate 10, a similar or different mechanism may be enlisted as that used for mounting integrated circuit chip 20. That is, for example, passive device 20 may be mounted onto substrate 10 using solder, a conductive adhesive, and/or other die-attach material. Passive device 20 may include one or more bond pads 62 for electrically coupling, via wire 66, passive device 20 with one or more bond pads 60 located on substrate 10.

Figure 5:
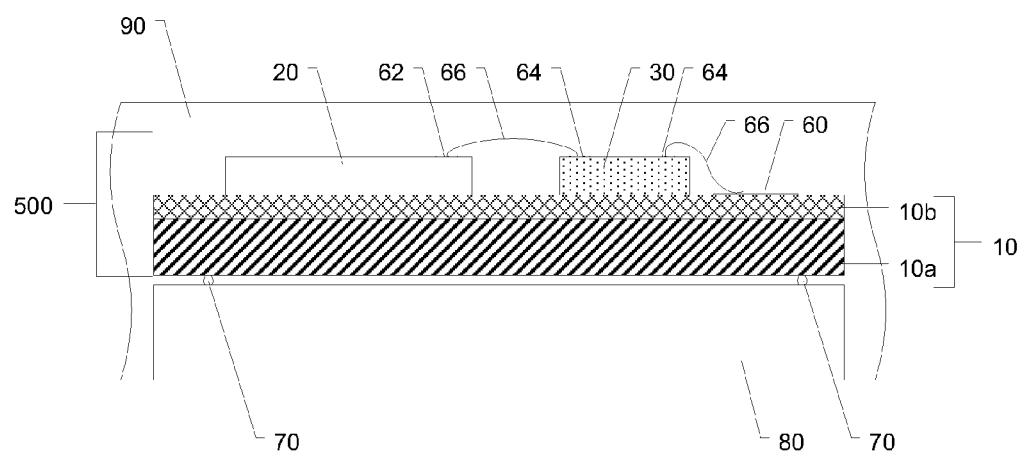
FIG. 5 is a cross-sectional side view of an integrated passive device module including a microelectronic package, in accordance with various embodiments of the present invention.

In various embodiments, the microelectronic device may be integrated into an integrated passive device (IPD) module. For example, illustrated in FIG. 5 is an IPD module comprising a microelectronic device 500 including a substrate 10 comprising a silicon layer 10a and a glass layer 10b, with one or more integrated passive devices 20 and one or more integrated circuit chips 30 mounted thereon according to one or more die-attach mechanisms described previously. Integrated passive device 20 includes one or more bond pads 62 for electrically coupling, via wires 66, to bond pad 64 of integrated circuit chip 30. In the illustrated embodiment, integrated circuit chip 30 is electrically coupled, via wires 66, with one or more bond pads 60 on substrate 10.

Still referring to FIG. 5, microelectronic device 500 is mounted onto a carrier substrate 80, such as, for example, a printed circuit board. As illustrated, microelectronic device 500 is mounted onto and electrically interconnected with carrier substrate 80 via one or more solder bumps 70. In some of the embodiments enlisting solder bumps 70, an underfill material (not shown) may be included to fill in vacant spaces, which may provide additional mechanical stability. In other embodiments, microelectronic device 500 may instead be mounted to carrier substrate 80 using, for example, a die-attach material. Instead of solder bumps, microelectronic device 500 may be electrically coupled to carrier substrate 80 via wires, depending on the application.

The IPD module illustrated in FIG. 5 further includes a protective housing 90 enclosing microelectronic device 500. Protective housing 90 may comprise an encapsulant material, such as an epoxy or polymeric material, which may be molded over part or all components of microelectronic device 500 as desired. In various other embodiments, a pre-molded cavity such as, for example, a metal can, a ceramic cavity, or a plastic cavity, may be enlisted, depending on the application.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. An integrated passive device (IPD) module comprising:
 a microelectronic device including
  a silicon layer, wherein a surface of the silicon layer comprises a (i) first section and (ii) a remaining section that comprises the entire surface of the silicon layer excluding the first section,
  a glass layer formed on the silicon layer, the glass layer having a pre-determined thickness,
  a passive device mounted on the glass layer such that the passive device occupies the first section of the silicon layer, wherein the glass layer is formed only on the first section of the silicon layer, and the glass layer is not formed on the remaining section of the silicon layer, wherein the pre-determined thickness of the glass layer separates the passive device from the silicon layer such that electrical interaction between the passive device and the silicon layer is eliminated; and
  an integrated circuit chip electrically coupled to the passive device, wherein the passive device is disposed between the integrated circuit chip and the glass layer.

2. The IPD module of claim 1, wherein the electrical interaction that is eliminated between the passive device and the silicon layer corresponds to conduction between the silicon layer and the passive device.

3. The IPD module of claim 1, wherein the microelectronic device is included in an apparatus selected from a group comprising a mobile phone, a laptop computer, a personal digital assistant, a gaming device, a music player, and a video player.

4. The IPD module of claim 1, wherein the passive device is one of an inductor, a capacitor, or a resistor.

* * * * *